(12) United States Patent  
Iwasaki et al.

(10) Patent No.: US 12,244,300 B2
(45) Date of Patent: Mar. 4, 2025

(54) LADDER-TYPE FILTER AND MULTIPLEXER

(71) Applicant: TAIYO YUDEN CO., LTD., Tokyo (JP)

(72) Inventors: Sho Iwasaki, Tokyo (JP); Hitoshi Tsukidate, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 397 days.

(21) Appl. No.: 17/723,320

(22) Filed: Apr. 18, 2022

(65) Prior Publication Data

US 2022/0368313 A1 Nov. 17, 2022

(30) Foreign Application Priority Data

May 17, 2021 (JP) .................................. 2021-083401
May 24, 2021 (JP) .................................. 2021-086702

(51) Int. Cl.
*H03H 9/60* (2006.01)
*H03H 9/13* (2006.01)
*H03H 9/205* (2006.01)
*H03H 9/70* (2006.01)

(52) U.S. Cl.
CPC .............. *H03H 9/605* (2013.01); *H03H 9/13* (2013.01); *H03H 9/205* (2013.01); *H03H 9/70* (2013.01)

(58) Field of Classification Search
None
See application file for complete search history.

(56) References Cited

U.S. PATENT DOCUMENTS

| 6,480,075 B1* | 11/2002 | Fujita ................... H03H 9/6483 333/195 |
| 11,196,404 B2* | 12/2021 | Yamamoto ......... H03H 9/02866 |
| 11,336,259 B2* | 5/2022 | Yamamoto ............. H03H 9/725 |

(Continued)

FOREIGN PATENT DOCUMENTS

| JP | 2015-73331 A | 4/2015 |
| JP | 2017-34363 A | 2/2017 |

(Continued)

OTHER PUBLICATIONS

Notice of Reasons for Refusal issued on Dec. 3, 2024 in a counterpart Japanese Patent Application No. 2021-086702.

*Primary Examiner* — Isam A Alsomiri
*Assistant Examiner* — Jonathan D Armstrong
(74) *Attorney, Agent, or Firm* — Stein IP LLC

(57) ABSTRACT

A ladder-type filter includes a support substrate, a piezoelectric layer provided on the support substrate, a parallel resonator including first electrode fingers provided on the piezoelectric layer and having a first average pitch and a first average duty ratio, a largest first average pitch being equal to or greater than two times a thickness of the piezoelectric layer, a first end of the parallel resonator being coupled to a path between input and output terminals, a second end of the parallel resonator being coupled to a ground, and a series resonator connected in series between the input and output terminals, the series resonator including second electrode fingers provided on the piezoelectric layer and having a second average pitch and a second average duty ratio, a second average duty ratio in at least one series resonator being less than a smallest first average duty ratio.

9 Claims, 14 Drawing Sheets

(56) References Cited

U.S. PATENT DOCUMENTS

| | | | |
|---|---|---|---|
| 11,595,019 B2 * | 2/2023 | Kakita | H03H 9/02834 |
| 11,664,784 B2 * | 5/2023 | Kakita | H10N 30/072 |
| | | | 333/193 |
| 2013/0285768 A1 | 10/2013 | Watanabe et al. | 333/193 |
| 2017/0033765 A1 | 2/2017 | Moriya et al. | |
| 2018/0254763 A1 * | 9/2018 | Yamamoto | H03H 9/6483 |
| 2018/0337655 A1 | 11/2018 | Hamasaki | |
| 2019/0326878 A1 * | 10/2019 | Kakita | H03H 9/6483 |
| 2020/0313650 A1 * | 10/2020 | Yamamoto | H03H 9/725 |
| 2020/0328728 A1 * | 10/2020 | Nakagawa | H04B 1/0057 |
| 2021/0006231 A1 * | 1/2021 | Kakita | H10N 30/072 |
| 2021/0288628 A1 * | 9/2021 | Nishimura | H03H 9/145 |
| 2022/0216853 A1 | 7/2022 | Taniguchi et al. | |
| 2023/0275569 A1 * | 8/2023 | Nozoe | H03H 9/6433 |
| 2023/0308078 A1 * | 9/2023 | Kasamatsu | H03H 9/02574 |

FOREIGN PATENT DOCUMENTS

| | | |
|---|---|---|
| JP | 2018-196028 A | 12/2018 |
| JP | 2019-201345 A | 11/2019 |
| WO | WO 2021/060150 A1 | 4/2021 |

* cited by examiner

LADDER-TYPE FILTER AND MULTIPLEXER

CROSS-REFERENCE TO RELATED APPLICATION

This application is based upon and claims the benefits of priorities of the prior Japanese Patent Application No. 2021-083401, filed on May 17, 2021, and the prior Japanese Patent Application No. 2021-086702, filed on May 24, 2021, entire contents of which are incorporated herein by reference.

FIELD

A certain aspect of the present embodiments relates to a ladder-type filter and a multiplexer.

BACKGROUND

There have been known acoustic wave resonators having a pair of comb-shaped electrodes formed on a piezoelectric layer as acoustic wave resonators used in communication devices such as smartphones. It is known to bond the piezoelectric layer to a support substrate and adjust the thickness of the piezoelectric layer to be equal to or less than the wavelength of the acoustic wave as disclosed in, for example, Japanese Patent Application Publication No. 2017-34363 (Patent Document 1). It is known to provide an insulating layer between the support substrate and the piezoelectric layer as disclosed in, for example, Japanese Patent Application Publication Nos. 2019-201345 and 2015-73331 (Patent Documents 2 and 3). It is known to adjust the duty ratio in the parallel resonator to be less than the duty ratio in the series resonator in a ladder-type filter using an acoustic wave resonator in which a thick dielectric layer for temperature compensation is provided on the comb-shaped electrodes, as disclosed in, for example, Japanese Patent Application Publication No. 2018-196028 (Patent Document 4).

SUMMARY

In a ladder-type filter using the acoustic wave resonator having comb-shaped electrodes and a piezoelectric layer bonded on a support substrate, it is desired to reduce the temperature coefficient of frequency (TCF).

According to an aspect of the present disclosure, there is provided a ladder-type filter including: a support substrate; a piezoelectric layer provided on the support substrate; one or more parallel resonators each including a plurality of first electrode fingers provided on the piezoelectric layer, the first electrode fingers having a first average pitch and a first average duty ratio, a largest first average pitch being equal to or greater than two times a thickness of the piezoelectric layer, a first end of each of the one or more parallel resonators being coupled to a path between an input terminal and an output terminal, a second end of each of the one or more parallel resonators being coupled to a ground; and one or more series resonators connected in series between the input terminal and the output terminal, each of the one or more series resonators including a plurality of second electrode fingers provided on the piezoelectric layer, the second electrode fingers having a second average pitch and a second average duty ratio, the second average duty ratio in at least one series resonator being less than a smallest first average duty ratio.

According to another aspect of the present disclosure, there is provided a multiplexer including the above ladder-type filter.

DETAILED DESCRIPTION

Patent Document 4 describes that the temperature coefficient of resonant frequency (TCF) and the temperature coefficient of antiresonant frequency (TCF) depend on the duty ratio in the acoustic wave resonator in which a dielectric film thicker than the comb-shaped electrode is formed on the comb-shaped electrode provided on a lithium niobate substrate. In such an acoustic wave resonator, a Rayleigh wave is the primary mode. Meanwhile, it has been considered that the temperature coefficient of antiresonant frequency and the temperature coefficient of resonant frequency do not depend on the duty ratio in the case that a thick dielectric film is not provided on the comb-shaped electrode. One of such acoustic wave resonators is an acoustic wave resonator that uses a lithium tantalate substrate and has a shear horizontal (SH) wave as a primary mode. The inventors have found that the temperature coefficient of resonant frequency and the temperature coefficient of antiresonant frequency depend on the duty ratio when the piezoelectric layer is made to be thin, even in the acoustic wave resonator in which a thick dielectric film covering the comb-shaped electrode is not provided and the SH wave is the primary mode. Hereinafter, embodiments based on the above findings will be described.

First Embodiment

Figure 1A:
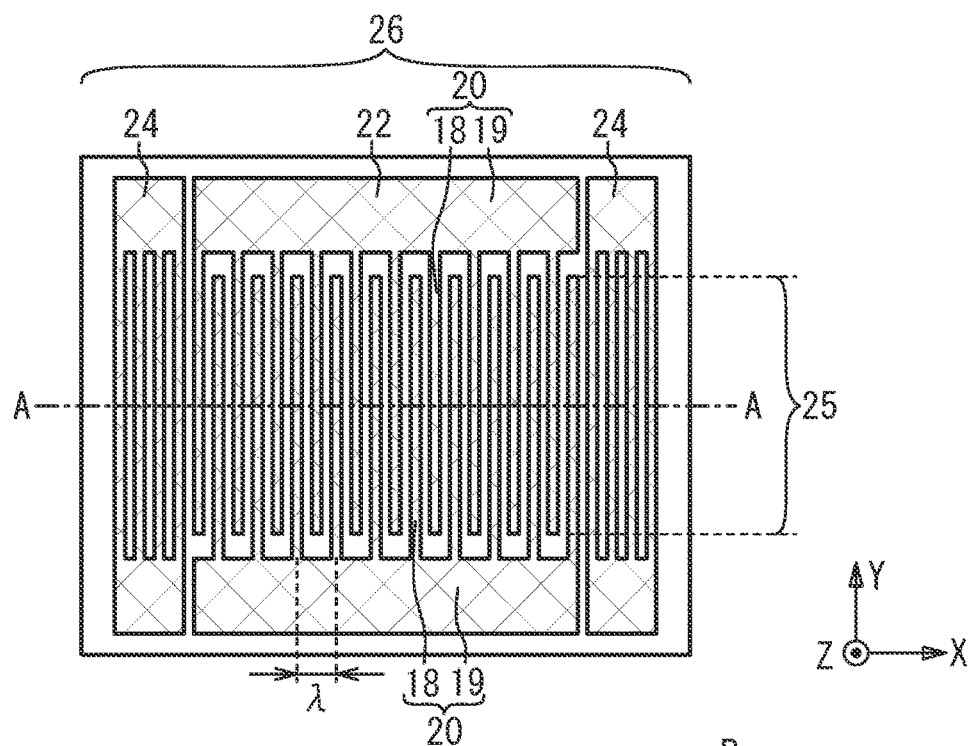
FIG. 1A is a plan view of an acoustic wave resonator used in a ladder-type filter in accordance with a first embodiment.
Figure 1B:
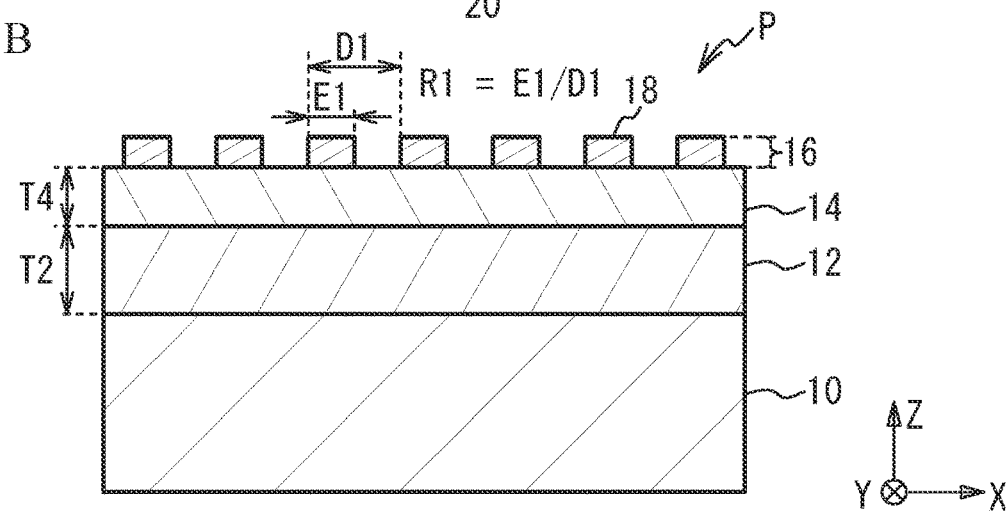
FIG. 1B and FIG. 1C are cross-sectional views taken along line A-A in FIG. 1A.
Figure 1C:
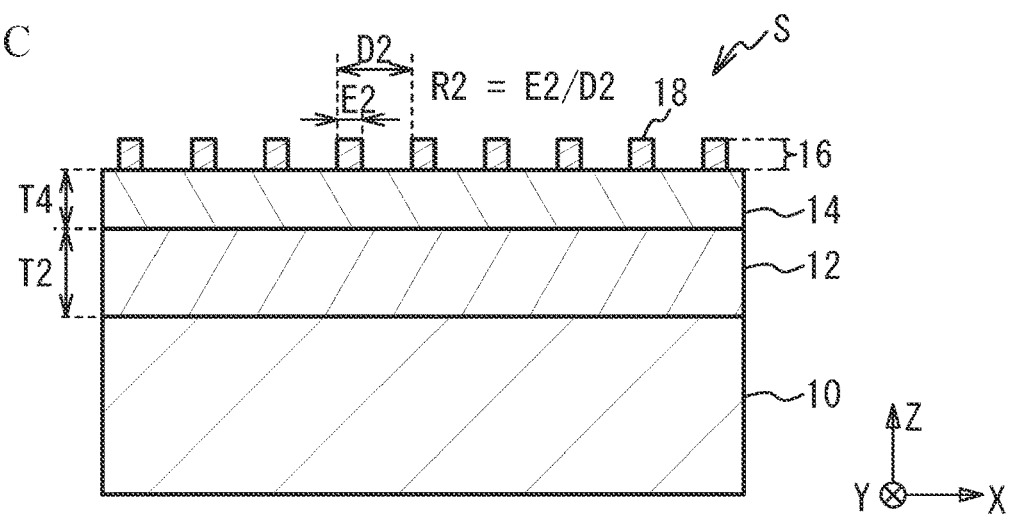

A first embodiment is an exemplary ladder-type filter. FIG. 1A is a plan view of an acoustic wave resonator used in a ladder-type filter in accordance with the first embodiment, and FIG. 1B and FIG. 1C are cross-sectional views taken along line A-A in FIG. 1A. FIG. 1B and FIG. 1C are cross-sectional views of a parallel resonator P and a series resonator S, respectively. The direction in which electrode fingers are arranged (the arrangement direction of the electrode fingers) is defined as an X direction, the direction in which the electrode fingers extend (the extension direction of the electrode fingers) is defined as a Y direction, and the direction in which a support substrate and a piezoelectric layer are stacked (the stack direction) is defined as a Z direction. The X direction, the Y direction, and the Z direction do not necessarily correspond to the X-axis orientation and the Y-axis orientation of the crystal orientation of the piezoelectric layer. In the case that the piezoelectric layer is a rotated Y-cut X-propagation substrate, the X direction is the X-axis orientation of the crystal orientation.

As illustrated in FIG. 1A to FIG. 1C, a piezoelectric layer 14 is provided over a support substrate 10. A temperature compensation film 12 is interposed between the support substrate 10 and the piezoelectric layer 14. An acoustic wave resonator 26 is disposed on the piezoelectric layer 14. The acoustic wave resonator 26 includes an interdigital transducer (IDT) 22 and reflectors 24. The reflectors 24 are located at both sides of the IDT 22 in the X direction. The IDT 22 and the reflectors 24 are formed of a metal film 16 on the piezoelectric layer 14.

The IDT 22 includes a pair of comb-shaped electrodes 20 opposite to each other. The comb-shaped electrode 20 includes a plurality of electrode fingers 18 and a bus bar 19 to which the electrode fingers 18 are coupled. The region where the electrode fingers 18 of one of the pair of the comb-shaped electrodes 20 and the electrode fingers 18 of the other of the pair of the comb-shaped electrodes 20 overlap as viewed from the X direction is an overlap region 25. The length of the overlap region 25 is an aperture length. The electrode fingers 18 of one of the pair of the comb-shaped electrodes 20 and the electrode fingers 18 of the other of the pair of the comb-shaped electrodes 20 are alternately arranged in at least a part of the overlap region 25. The acoustic wave mainly excited by the electrode fingers 18 in the overlap region 25 propagates mainly in the X direction. The pitch of the electrode fingers 18 of one of the pair of the comb-shaped electrodes 20 is approximately equal to the wavelength $\lambda$ of the comb-shaped electrode 20. When the pitch of the electrode fingers 18 (the pitch between the centers of the electrode fingers 18) is represented by D, the pitch of the electrode fingers 18 of one of the comb-shaped electrodes 20 is equal to two times the pitch D of the electrode fingers 18. The reflectors 24 reflect the acoustic wave (the surface acoustic wave) excited by the electrode fingers 18 of the IDT 22. As a result, the acoustic wave is confined in the overlap region 25 of the IDT 22.

The piezoelectric layer 14 is, for example, a monocrystalline lithium tantalate (LiTaO$_3$) layer, and is, for example, a rotated Y-cut X-propagation lithium tantalate layer. In the case that the piezoelectric layer is a 36° or greater and 48° or less rotated Y-cut X-propagation lithium tantalate layer, the SH wave is the acoustic wave that is the primary mode. The thickness of the piezoelectric layer 14 is equal to or less than the wavelength k of the acoustic wave (i.e., equal to or less than two times the pitch D).

The support substrate 10 is, for example, a sapphire substrate, an alumina substrate, a silicon substrate, a spinel substrate, a crystal substrate, a quartz substrate, or a silicon carbide substrate. The sapphire substrate is a monocrystalline Al$_2$O$_3$ substrate. The alumina substrate is a polycrystalline or amorphous Al$_2$O$_3$ substrate. The silicon substrate is a monocrystalline or polycrystalline silicon substrate. The spinel substrate is a polycrystalline or amorphous MgAl$_2$O$_4$ substrate. The crystal substrate is a monocrystalline SiO$_2$ substrate. The quartz substrate is a polycrystalline or amorphous SiO$_2$ substrate. The silicon carbide substrate is a polycrystalline or monocrystalline SiC substrate. The linear expansion coefficient of the support substrate 10 in the X direction is less than the linear expansion coefficient of the piezoelectric layer 14 in the X direction. This configuration can reduce the frequency temperature dependence of the acoustic wave resonator.

The temperature compensation film 12 has a temperature coefficient of elastic constant opposite in sign to the temperature coefficient of elastic constant of the piezoelectric layer 14. For example, the temperature coefficient of elastic constant of the piezoelectric layer 14 has a negative value, w % bile the temperature coefficient of elastic constant of the temperature compensation film 12 has a positive value. The temperature compensation film 12 is an insulating film mainly composed of silicon oxide (SiO$_2$), is, for example, an additive-free silicon oxide (SiO$_2$) film or a silicon oxide (SiO$_2$) film to which additive elements such as fluorine are added, and is, for example, polycrystalline or amorphous. This configuration can reduce the temperature coefficient of frequency of the acoustic wave resonator. In the case that the temperature compensation film 12 is a silicon oxide film, the acoustic velocity of the bulk wave propagating through the temperature compensation film 12 is less than the acoustic velocity of the bulk wave propagating through the piezoelectric layer 14. The term "a certain layer is mainly composed of a certain material" means that impurities may be intentionally or unintentionally contained in the certain layer, and the concentration of the certain material in the certain layer is, for example, 50 atomic % or greater, or 80 atomic % or greater. In the case that the temperature compensation film 12 is mainly composed of silicon oxide, the sum of the oxygen concentration and the silicon concentration in the temperature compensation film 12 is, for example, 50 atomic % or greater, or 80 atomic % or greater. Each of the oxygen concentration and the silicon concentration in the temperature compensation film 12 is, for example, 10 atomic % or greater, or 20 atomic % or greater.

In order for the temperature compensation film 12 to have a temperature compensation function, the energy of the acoustic wave that is the primary mode is required to exist within the temperature compensation film 12 to some extent. Although the section in which the energy of the surface acoustic wave concentrates depends on the type of the surface acoustic wave, the energy of the surface acoustic wave typically concentrates in the section from the upper surface of the piezoelectric layer 14 to a depth of 2$\lambda$ ($\lambda$ is the wavelength of the acoustic wave), particularly in the section from the upper surface of the piezoelectric layer 14 to a depth of $\lambda$. Therefore, the distance from the lower surface of the temperature compensation film 12 to the upper surface of the piezoelectric layer 14 is preferably 2$\lambda$ or less, more preferably $\lambda$ or less, further preferably 0.6$\lambda$ or less.

The metal film 16 is a film mainly composed of, for example, aluminum (Al), copper (Cu), or molybdenum (Mo). An adhesion film such as a titanium (Ti) film or a chrome (Cr) film may be provided between the electrode fingers 18 and the piezoelectric layer 14. The adhesion film is thinner than the electrode finger 18. An insulating film thinner than the electrode fingers 18 may be provided so as to cover the electrode fingers 18. The insulating film serves as a protective film.

When the pitch of the electrode fingers 18 in the parallel resonator P is represented by D1, and the width of the electrode finger 18 in the parallel resonator P is represented by E1 as illustrated in FIG. 1B, the duty ratio R1=E1/D1. When the pitch of the electrode fingers 18 in the series resonator S is represented by D2, and the width of the electrode finger 18 in the series resonator S is represented by E2 as illustrated in FIG. 1C, the duty ratio R2=E2/D2. The pitch D2 in the series resonator S is less than the pitch D1 in the parallel resonator P. and the duty ratio R2 in the series resonator S is less than the duty ratio R1 in the parallel resonator P.

Figure 2A:
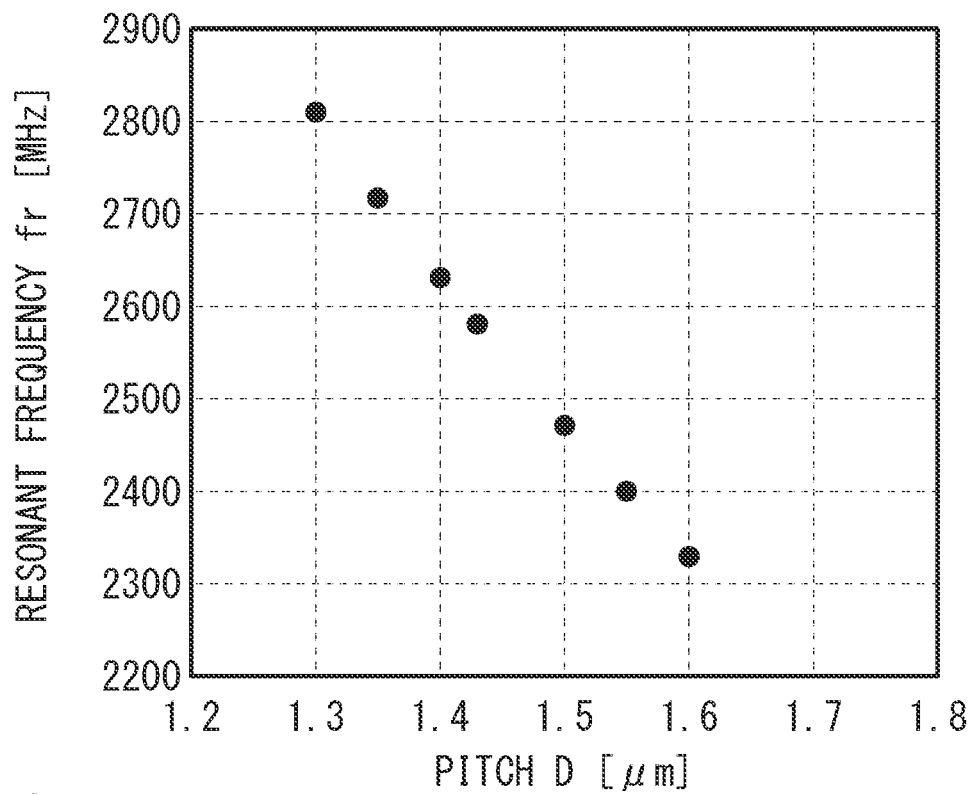
FIG. 2A is a graph of resonant frequency fr versus pitch D of the acoustic wave resonator in the first embodiment.
Figure 2B:
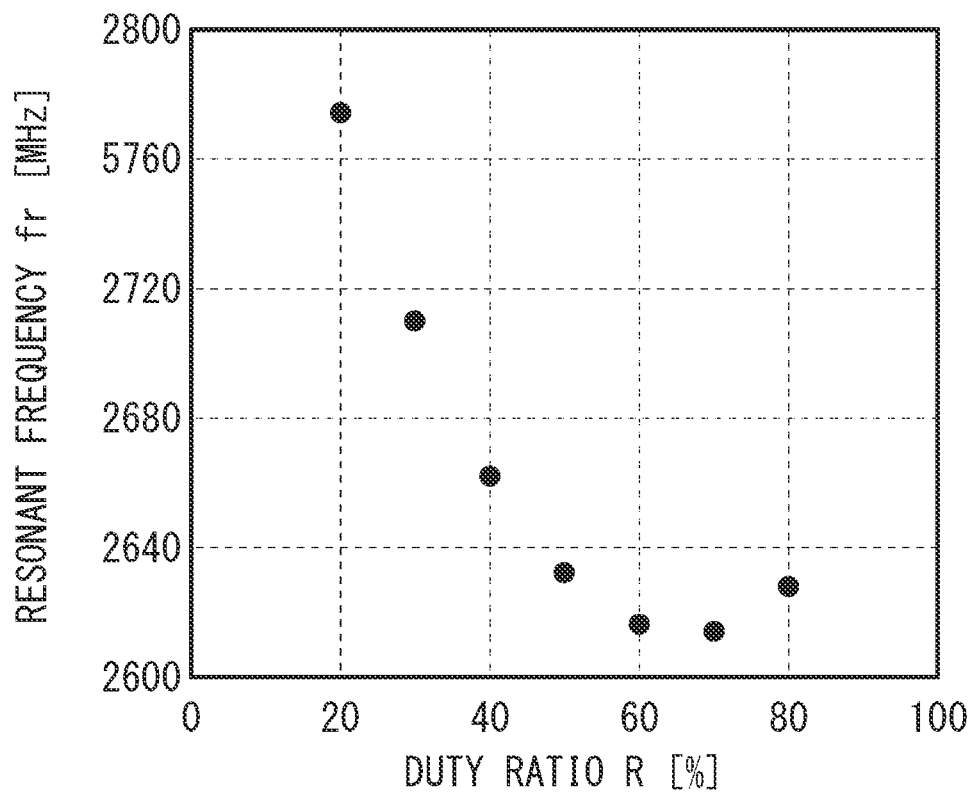
FIG. 2B is a graph of resonant frequency fr versus duty ratio R.

FIG. 2A is a graph of resonant frequency fr versus pitch D of the acoustic wave resonator in the first embodiment, and FIG. 2B is a graph of resonant frequency fr versus duty ratio R. As presented in FIG. 2A, as the pitch D decreases, the resonant frequency fr becomes higher. When the pitch D changes by 0.3 μm, the resonant frequency fr changes by approximately 500 MHz.

As presented in FIG. 2B, as the duty ratio R changes, the resonant frequency fr changes. In the range where the duty ratio R is 60% or less, as the duty ratio R decreases, the resonant frequency fr becomes higher. In the range where the duty ratio R is 70% or greater, as the duty ratio R increases, the resonant frequency fr becomes higher. When the duty ratio R changes from 60% to 20% by 40%, the resonant frequency fr changes by approximately 160 MHz. As seen from the above, the change in resonant frequency fr due to the duty ratio R is small. Therefore, the resonant frequency fr is determined mainly by the pitch D.

Figure 3:
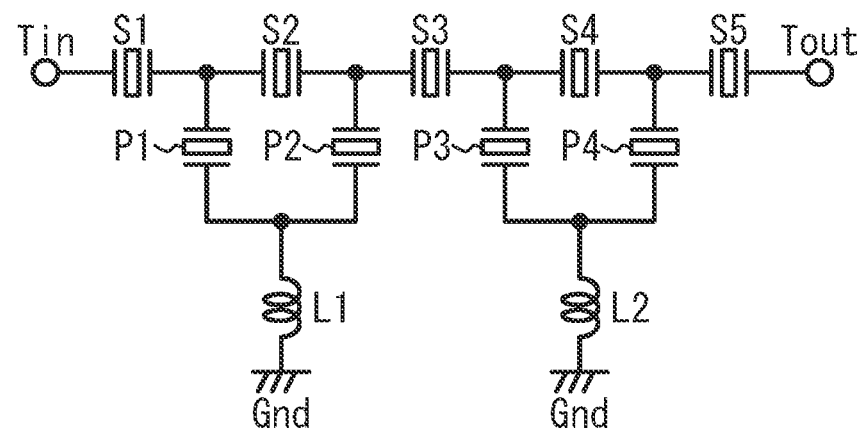
FIG. 3 is a circuit diagram of the ladder-type filter in accordance with the first embodiment.

FIG. 3 is a circuit diagram of the ladder-type filter in accordance with the first embodiment. As illustrated in FIG. 3, series resonators S1 to S5 are connected in series between an input terminal Tin and an output terminal Tout. First ends of parallel resonators P1 to P4 are coupled to a series path between the input terminal Tin and the output terminal Tout, second ends of the parallel resonators P1 and P2 are coupled to aground terminal Gnd through an inductor L1, and second ends of the parallel resonators P3 and P4 are coupled to the ground terminal Gnd through an inductor L2.

Figure 4:
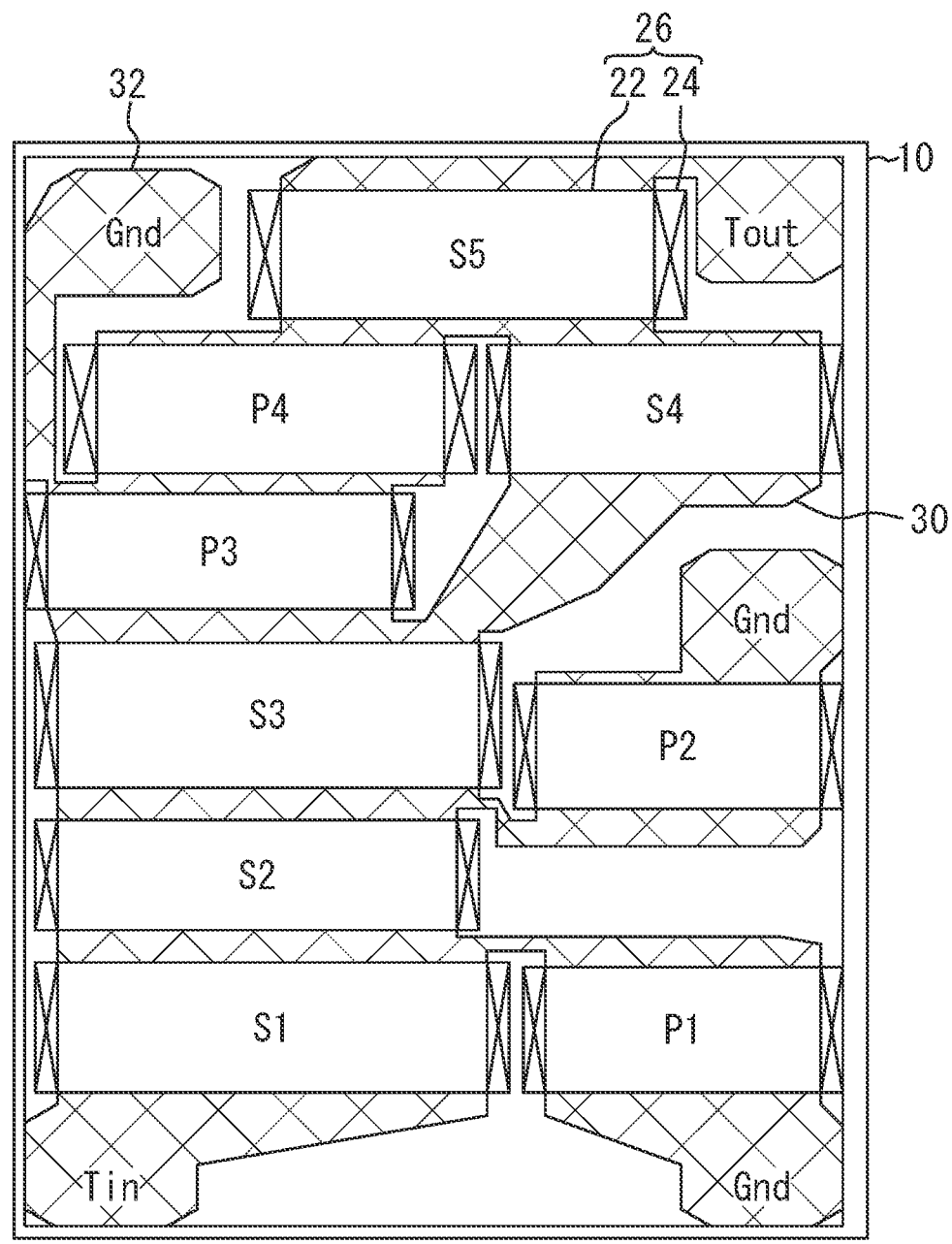
FIG. 4 is a plan view of the ladder-type filter in accordance with the first embodiment.

FIG. 4 is a plan view of the ladder-type filter in accordance with the first embodiment. As illustrated in FIG. 4, the acoustic wave resonators 26, wiring lines 30, and pads 32 are disposed on the piezoelectric layer 14. The acoustic wave resonator 26 includes the IDT 22 and the reflectors 24. The acoustic wave resonators 26 include the series resonators S1 to S5 and the parallel resonators P1 to P4. The wiring lines 30 electrically connect between the acoustic wave resonators 26, and electrically connect between the acoustic wave resonators 26 and the pads 32. The pads 32 are terminals for electrically connecting to an external device, and correspond to the input terminal Tin, the output terminal Tout, and the ground terminal Gnd. The wiring lines 30 and the pads 32 are formed of a metal layer including, for example, a gold layer, a copper layer, or an aluminum layer.

The number of series resonators S in the ladder-type filter may be one or more, the number of parallel resonators P in the ladder-type filter may be one or more, and these numbers can be freely determined.

Experiment 1

Figure 5:
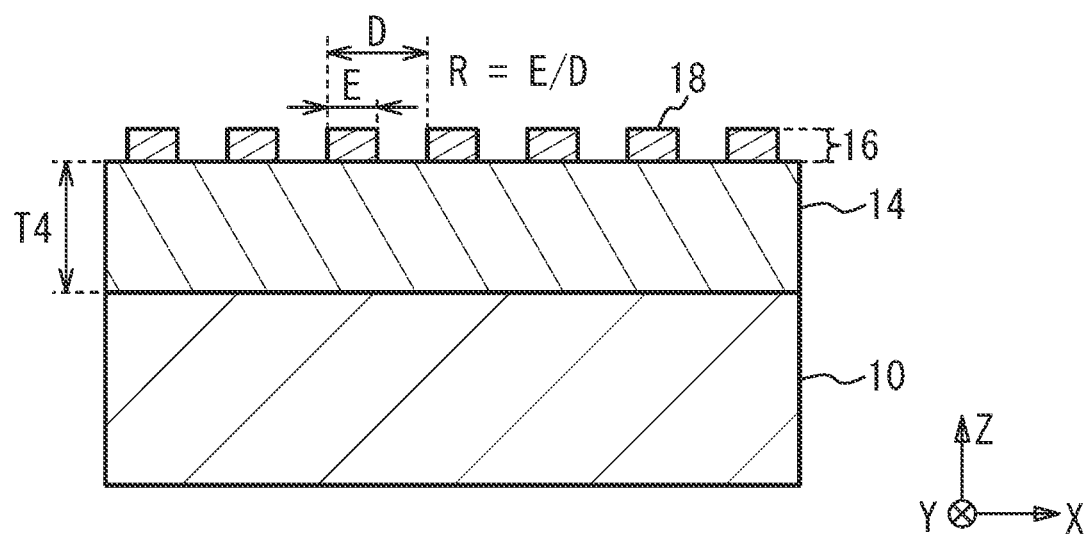
FIG. 5 is a cross-sectional view of a resonator B in an experiment 1.

For resonators A and B, the temperature coefficient of resonant frequency and the temperature coefficient of antiresonant frequency were measured. The resonator A has the structure illustrated in FIG. 1A to FIG. 1C. FIG. 5 is a cross-sectional view of the resonator B in the experiment 1. As illustrated in FIG. 5, in the resonator B, the temperature compensation film 12 is not provided, and the piezoelectric layer 14 is provided on the support substrate 10. Other structures are the same as those illustrated in FIG. 1A to FIG. 1C, and the description thereof is thus omitted.

The experiment conditions are as follows.
Support substrate 10: Sapphire substrate
Temperature compensation film 12: Silicon oxide film
Piezoelectric layer 14: 42° rotated Y-cut X-propagation lithium tantalate substrate
Metal film 16: Aluminum film
Resonator A
  Wavelength λ of the acoustic wave: 5.0 μm
  Thickness T2 of the temperature compensation film 12: 2.0 μm (0.4λ)
  Thickness T4 of the piezoelectric layer 14: 2.0 μm (0.4λ)
Resonator B
  Wavelength λ of the acoustic wave: 4.9 μm
  Thickness T4 of the piezoelectric layer 14: 20 μm (4.1λ)

Figure 6:
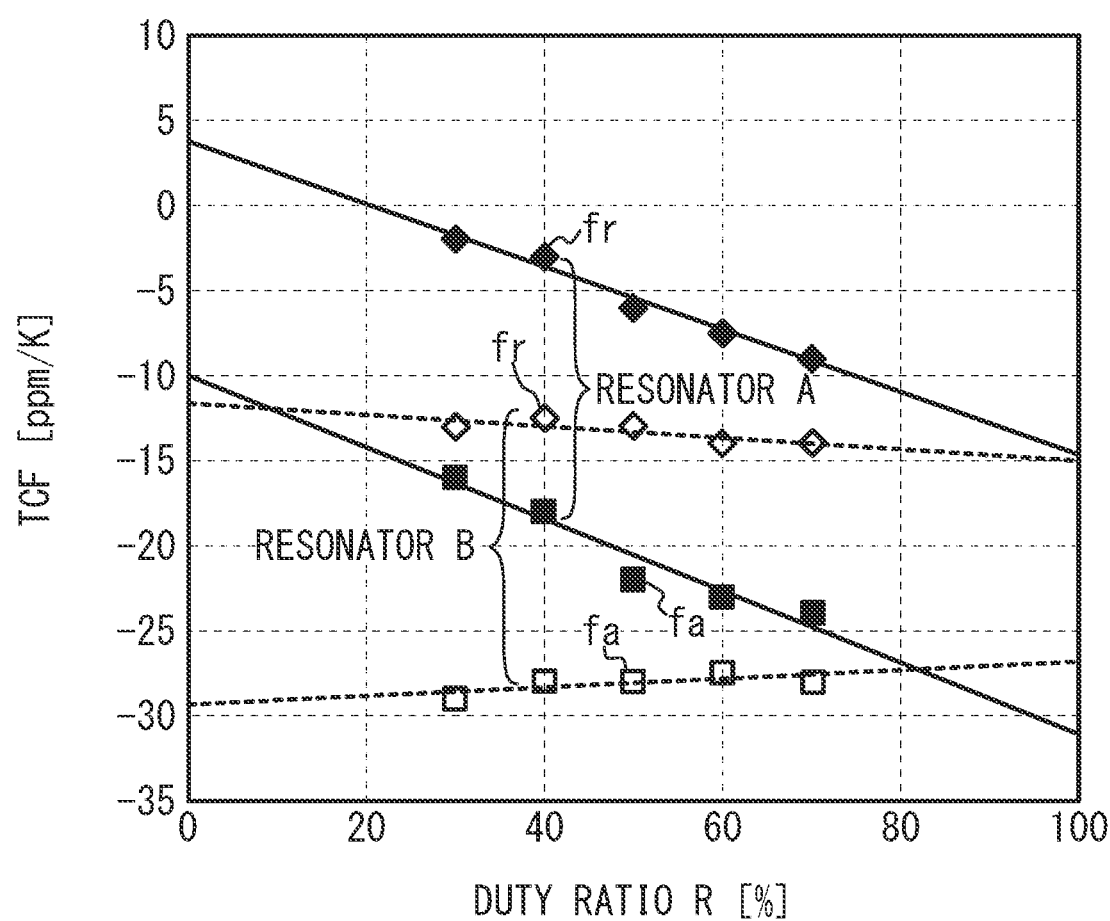
FIG. 6 is a graph of temperature coefficients of antiresonant frequency fa and resonant frequency fr (TCF) versus duty ratio in the experiment 1.

For the resonators A and B, the temperature coefficient of the resonant frequency fr (TCF) and the temperature coefficient of the antiresonant frequency fa (TCF) were measured for different duty ratios R. FIG. 6 is a graph of the temperature coefficient of the resonant frequency fr and the temperature coefficient of the antiresonant frequency fa versus duty ratio in the experiment 1. Dots indicate measurement points, and straight lines are approximate lines fitted by the least-square method. As presented in FIG. 6, in both the resonators A and B, the difference between the temperature coefficient of the resonant frequency fr and the temperature coefficient of the antiresonant frequency fa is approximately 15 ppm/K. In both the resonators A and B, the temperature coefficient of the resonant frequency fr is close to 0, but the temperature coefficient of the antiresonant frequency fa is negatively large (i.e., low). Furthermore, in the resonator B, even w % ben the duty ratio R changes, the TCF changes little. On the other hand, in the resonator A, as the duty ratio R decreases, the TCF moves toward the positive side, and becomes closer to 0.

Experiment 2

In the experiment 1, the resonator A differs from the resonator B in that the temperature compensation film 12 is provided. Furthermore, the thickness T4 of the piezoelectric layer 14 is 4.1λ in the resonator B, while the thickness T4 of the piezoelectric layer 14 is 0.6λ in the resonator A. Therefore, an experiment 2 was conducted to investigate whether the dependence of the TCF on the duty ratio R in the resonator A is due to the thickness T4 of the piezoelectric layer 14 or the temperature compensation film 12.

Figure 7:
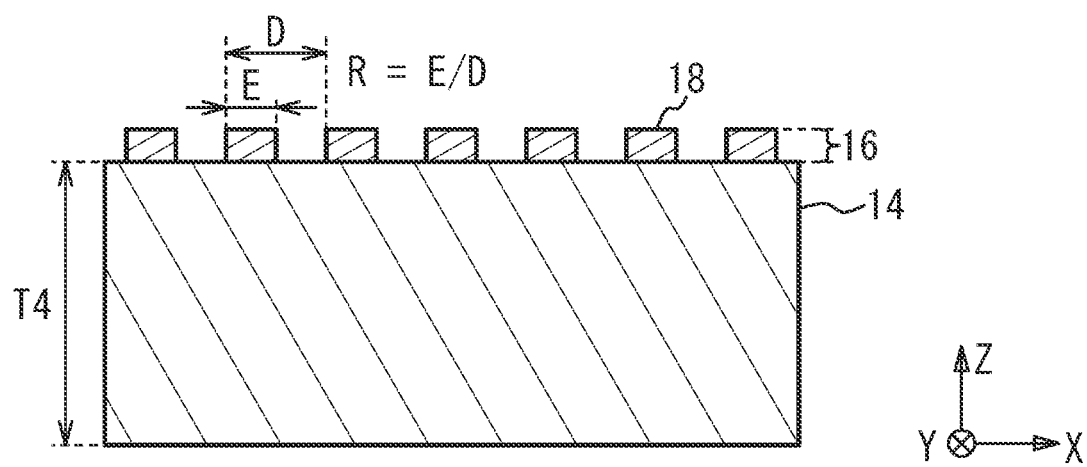
FIG. 7 is a cross-sectional view of a resonator in an experiment 2.

FIG. 7 is a cross-sectional view of a resonator in the experiment 2. As illustrated in FIG. 7, the piezoelectric layer 14 is a single layer, and has neither support substrate nor insulating layer. Other structures are the same as those illustrated in FIG. 1A to FIG. 1C, and the description thereof is thus omitted. The experiment conditions are as follows.

Piezoelectric layer 14: 42° rotated Y-cut X-propagation lithium tantalate substrate Metal film 16: Aluminum film Resonator C
  Wavelength λ of the acoustic wave: 2.2 μm
  Thickness T4 of the piezoelectric layer 14: 1.32 μm (0.6λ)
Resonator D
  Wavelength λ of the acoustic wave: 2.2 μm
  Thickness T4 of the piezoelectric layer 14: 8.8 μm (4.0λ)

Figure 8:
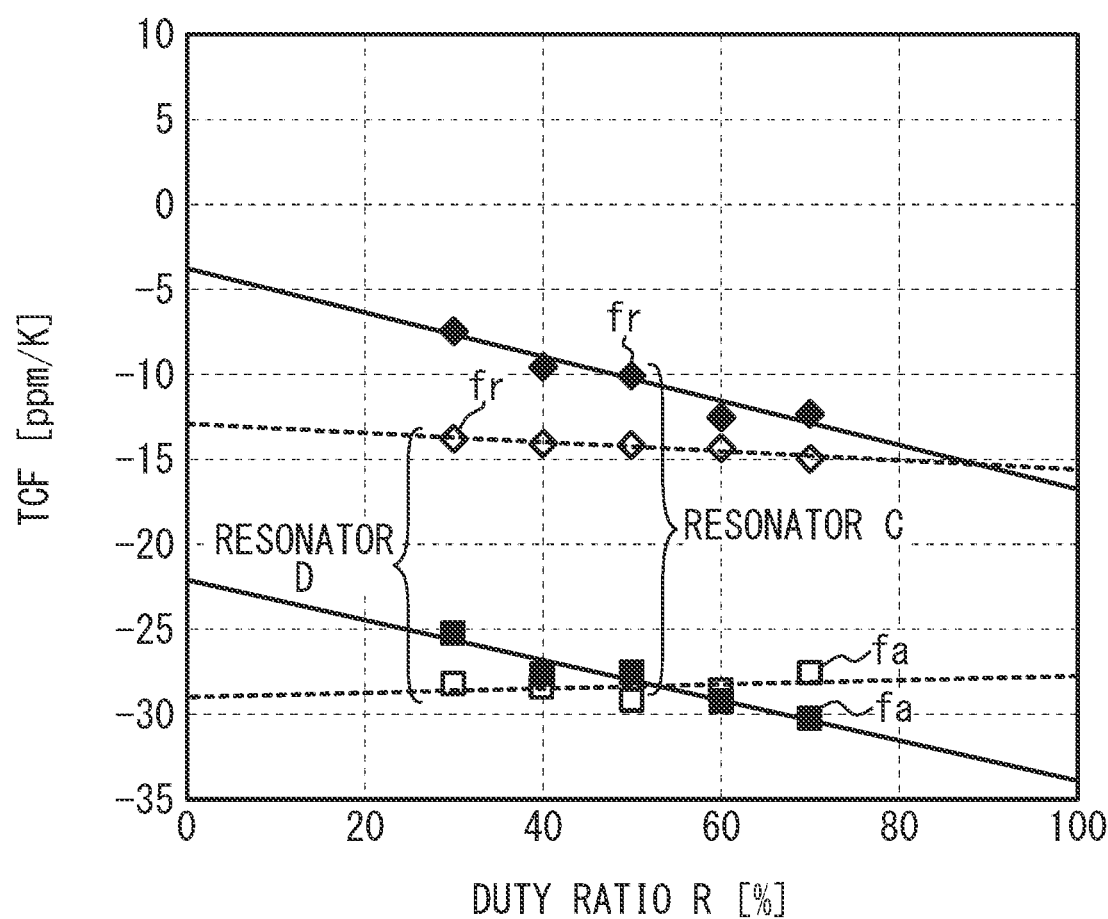
FIG. 8 is a graph of temperature coefficients of antiresonant frequency fa and resonant frequency fr (TCF) versus duty ratio in the experiment 2.

For the resonators C and D, the temperature coefficient of the resonant frequency fr and the temperature coefficient of the antiresonant frequency fa were measured for different duty ratios R. FIG. 8 is a graph of the temperature coefficient of the resonant frequency fr (TCF) and the temperature coefficient of the antiresonant frequency fa (TCF) versus duty ratio in the experiment 2. Dots indicate measurement points, and straight lines are approximate lines fitted by the least-square method. As presented in FIG. 8, in the resonator D, the temperature coefficient of the resonant frequency fr and the temperature coefficient of the antiresonant frequency fa depend little on the duty ratio R, while in the resonator C, as the duty ratio R decreases, the temperature coefficient of the resonant frequency fr and the temperature coefficient of the antiresonant frequency fa become closer to 0.

As seen from the above, as the thickness T4 of the piezoelectric layer 14 decreases, the temperature coefficient of the resonant frequency fr and the temperature coefficient of the antiresonant frequency fa become dependent on the duty ratio R Therefore, the reason why the TCF depends on the duty ratio R in the resonator A in the experiment 1 is considered because the thickness T4 of the piezoelectric layer 14 is small.

It is unclear why the TCF depends on the duty ratio R when the thickness T4 of the piezoelectric layer 14 is small, but it may be related to the fact that the surface acoustic waves such as the SH waves concentrate in the section from the surface of the piezoelectric layer 14 to a depth of approximately the wavelength λ of the acoustic wave. In consideration of that fact, it is considered that the TCF depends on the duty ratio R in the case that the thickness T4 of the piezoelectric layer 14 is λ or less. When the thickness of the piezoelectric layer 14 is adjusted to be λ or less, the mechanical strength of the piezoelectric layer 14 becomes small. Thus, the piezoelectric layer 14 is bonded to the support substrate 10.

Problem in Filter Characteristics

A description will be given of a problem in the case that the ladder-type filter is formed so that the duty ratio R1 in the parallel resonator P is the same as the duty ratio R2 in the series resonator S in the resonator A or B.

Figure 9A:
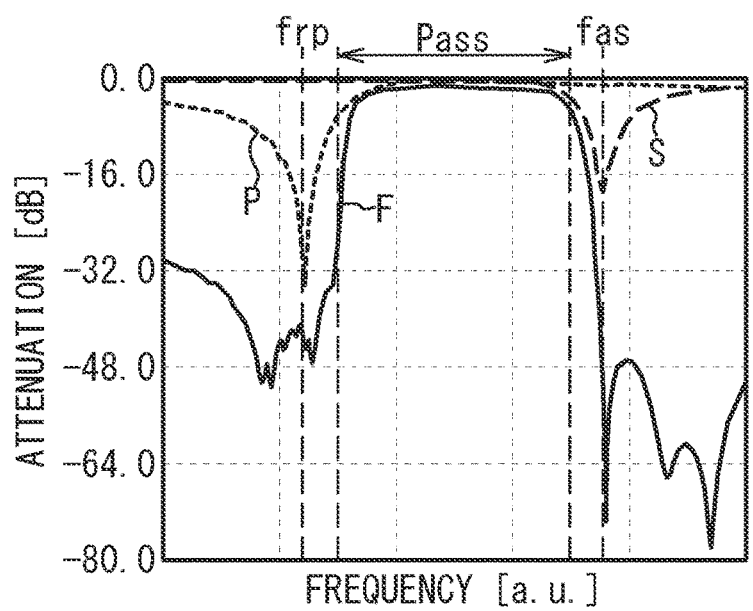
FIG. 9A and FIG. 9B schematically illustrate the transmission characteristics of a parallel resonator and a series resonator, and FIG. 9C schematically illustrates temperature dependence of the transmission characteristics of the filter.
Figure 9B:
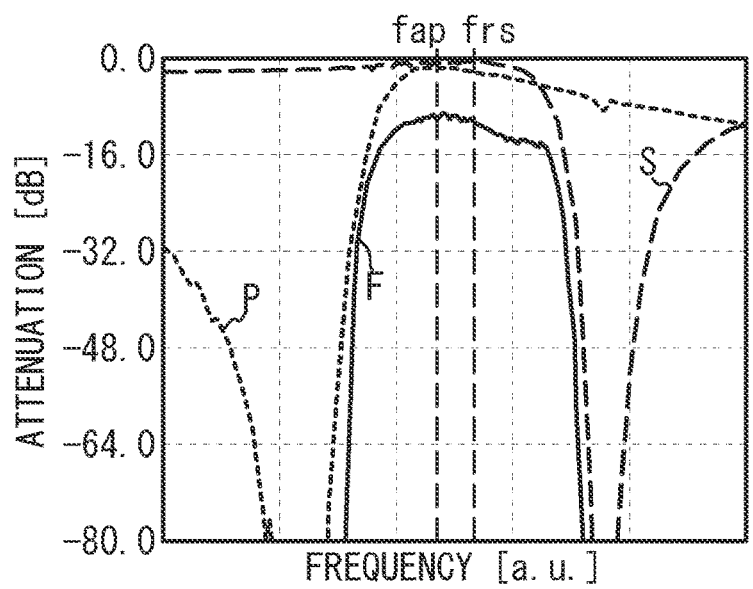
Figure 9C:
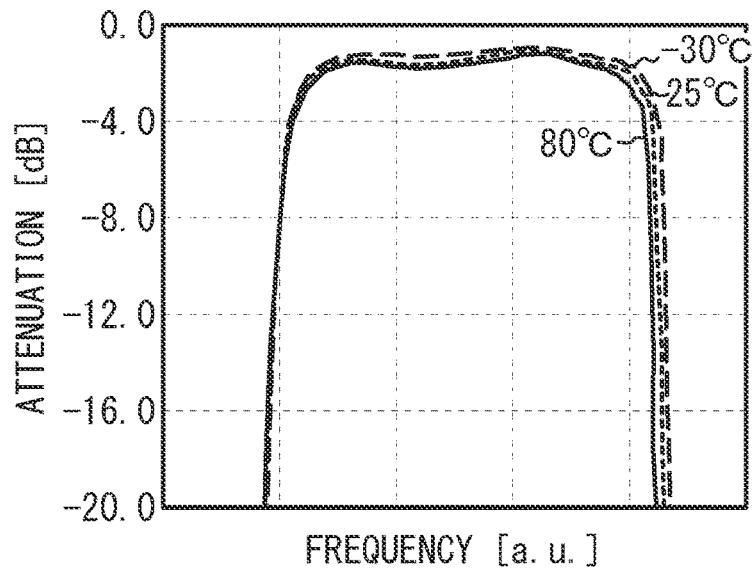

FIG. 9A and FIG. 9B schematically illustrate the transmission characteristics of the parallel resonator and the series resonator, and FIG. 9C illustrate temperature dependence of the transmission characteristics of the filter. FIG. 9B enlarges the attenuation in FIG. 9A. The transmission characteristics of the filter are represented by F, the transmission characteristics of the parallel resonator P are represented by P, and the transmission characteristics of the series resonator S are represented by S. The transmission characteristics of the parallel resonator P are the transmission characteristics in the case that the parallel resonator P is shunt-connected.

As illustrated in FIG. 9A and FIG. 9B, the attenuation pole at the frequency lower than the passband Pass of the filter F is formed by the resonant frequency frp of the parallel resonator P, and the attenuation pole at the frequency higher than the passband Pass is formed by the antiresonant frequency fas of the series resonator S. The antiresonant frequency fap of the parallel resonator P and the resonant frequency frs of the series resonator S are located within the passband Pass. As seen from the above, the low-frequency side skirt of the passband Pass in the ladder-type filter is formed mainly by the resonant frequency frp of the parallel resonator P. and the high-frequency side skirt of the passband Pass in the ladder-type filter is formed by the antiresonant frequency fas of the series resonator S.

As illustrated in FIG. 9C, the frequency of the low-frequency side skirt of the passband Pass varies little even when the temperature varies from −30° C. to 80° C., but the frequency of the high-frequency side skirt of the passband Pass decreases as the temperature varies from −30° C. to 80° C. The reason is as follows. The temperature coefficient of the frequency of the low-frequency side skirt, which is formed by the resonant frequency frp of the parallel resonator P, of the passband Pass is small because the temperature coefficient of the resonant frequency fr is close to 0 both in the resonators A and B as presented in FIG. 6. However, since the temperature coefficient of the antiresonant frequency fa is smaller than the temperature coefficient of the resonant frequency fr by 15 ppm/K, the temperature coefficient of the frequency of the high-frequency side skirt, which is formed by the antiresonant frequency fas of the series resonator S, of the passband Pass is negatively large.

In the first embodiment, the duty ratio R2 of the series resonator S is adjusted to be less than the duty ratio R1 of the parallel resonator P. This configuration can make the temperature coefficient of the antiresonant frequency fas of the series resonator S closer to 0 as presented in FIG. 6. For example, the duty ratio R1 in the parallel resonator P is adjusted to be 50%, and the duty ratio R2 in the series resonator S is adjusted to be 30%. This configuration can make the temperature coefficient of the resonant frequency frp of the parallel resonator P approximately −6 ppm/K and the temperature coefficient of the antiresonant frequency fas of the series resonator S approximately −16 ppm/K. Compared with the case in which the duty ratio R2 in the series resonator S is adjusted to be 50%, the temperature coefficient of the antiresonant frequency fas of the series resonator S is improved by approximately 6 ppm/K. The temperature coefficient of the antiresonant frequency fa is improved by approximately 1 ppm/K by reducing the duty ratio R by 5%. Therefore, the duty ratio R1− the duty ratio R2 (the difference between the duty ratio R1 and the duty ratio R2) is preferably 5% or greater, more preferably 10% or greater, further preferably 20% or greater.

First Variation of the First Embodiment

A first variation of the first embodiment is an example in which the resonant frequencies frp of the parallel resonators P1 to P4 differ from each other and the antiresonant frequencies fas of the series resonators S1 to S5 differ from each other. Table 1 lists the pitch, which is 2×D1, and the duty ratio R1 in the parallel resonators P1 to P4.

TABLE 1

|  | P1 | P2 | P3 | P4 |
| --- | --- | --- | --- | --- |
| 2 × D1 [μm] | 1.675 | 1.652 | 1.652 | 1.666 |
| R1 [%] | 50 | 50 | 50 | 50 |

Table 2 lists the pitch, which is 2×D2, and the duty ratio R2 in the series resonators S1 to S5.

TABLE 2

|  | S1 | S2 | S3 | S4 | S5 |
|---|---|---|---|---|---|
| 2 × D2 [μm] | 1.519 | 1.555 | 1.596 | 1.555 | 1.515 |
| R1 [%] | 50 | 40 | 30 | 40 | 50 |

As presented in Table 1, the pitches D1 in the parallel resonators P1 to P4 differ from each other. The duty ratios R1 are 50%, and are equal to each other. As presented in Table 2, the pitches D2 in the series resonators S1 to S5 differ from each other. In the series resonator S3 having the largest pitch D2 among the series resonators S1 to S5, the duty ratio R1 is 30%. In the series resonators S2 and S4 having a smaller pitch D2 than the series resonator S3, the duty ratio R2 is 40%. In the series resonators S1 and S5 having a smaller pitch D2 than the series resonators S2 and S4, the duty ratio R2 is 50%.

Figure 10A:
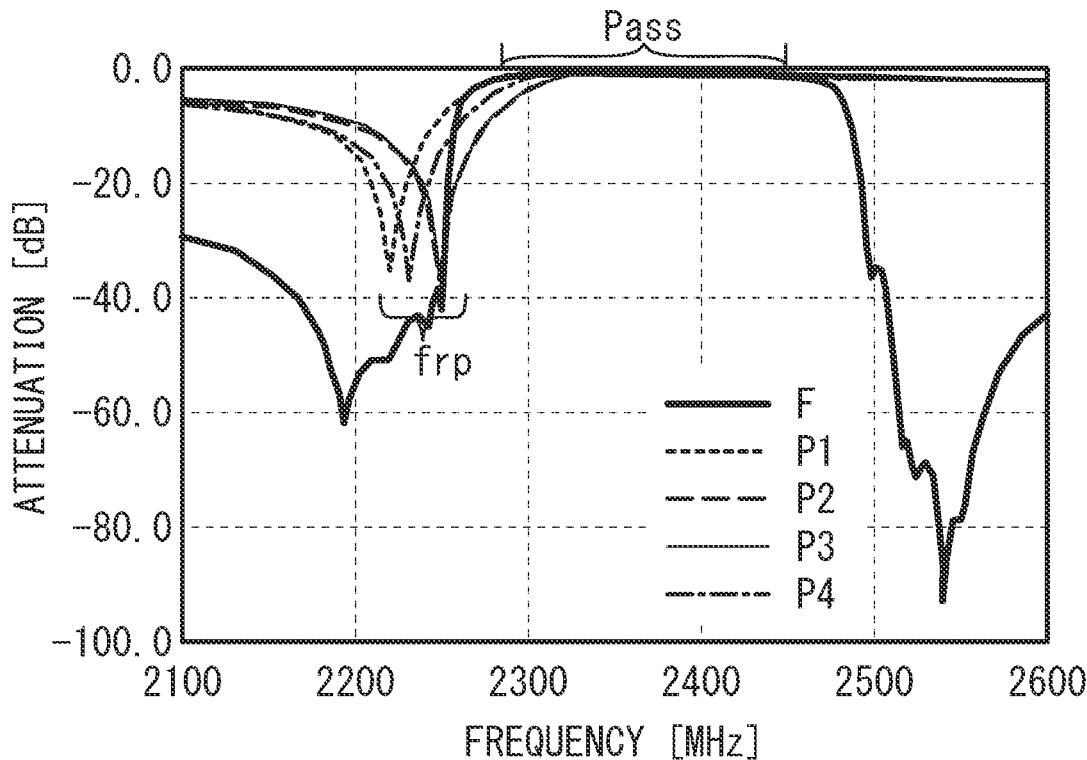
FIG. 10A and FIG. 10B schematically illustrate the transmission characteristics of the filter and the parallel resonator.
Figure 10B:
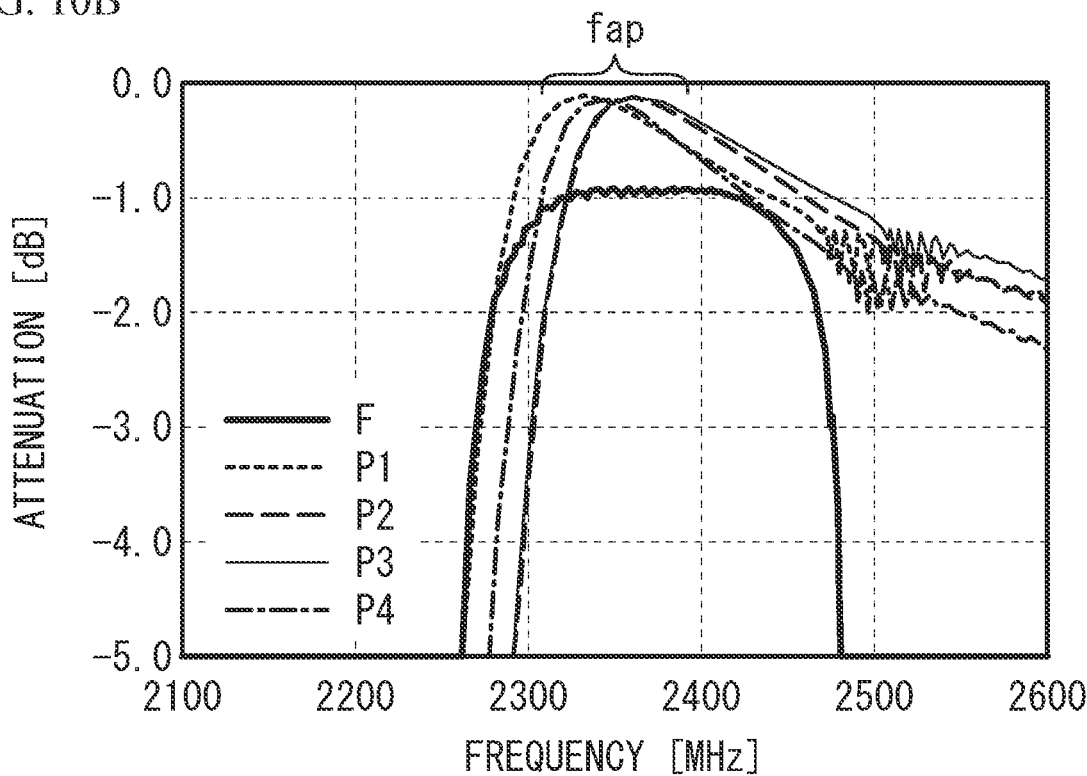

FIG. 10A and FIG. 10B schematically illustrate the transmission characteristics of the filter and the parallel resonator. FIG. 10B enlarges the attenuation in FIG. 10A. As illustrated in FIG. 10A and FIG. 10B, the resonant frequencies frp and the antiresonant frequencies fap of the parallel resonators P1 to P4 depend on the pitch D1. The attenuation range in the frequencies lower than the passband Pass can be widened by making the resonant frequencies frp of the parallel resonators P1 to P4 different from each other. The low-frequency side skirt of the passband Pass is formed by the parallel resonators P2 and P3 having the highest resonant frequency frp. As presented in FIG. 6, the temperature coefficient of the resonant frequency fr is close to 0. Therefore, the duty ratios R1 in the parallel resonators P1 to P4 are determined taking into consideration the resonance characteristics. For example, the duty ratios R1 are adjusted to be 50%.

Figure 11A:
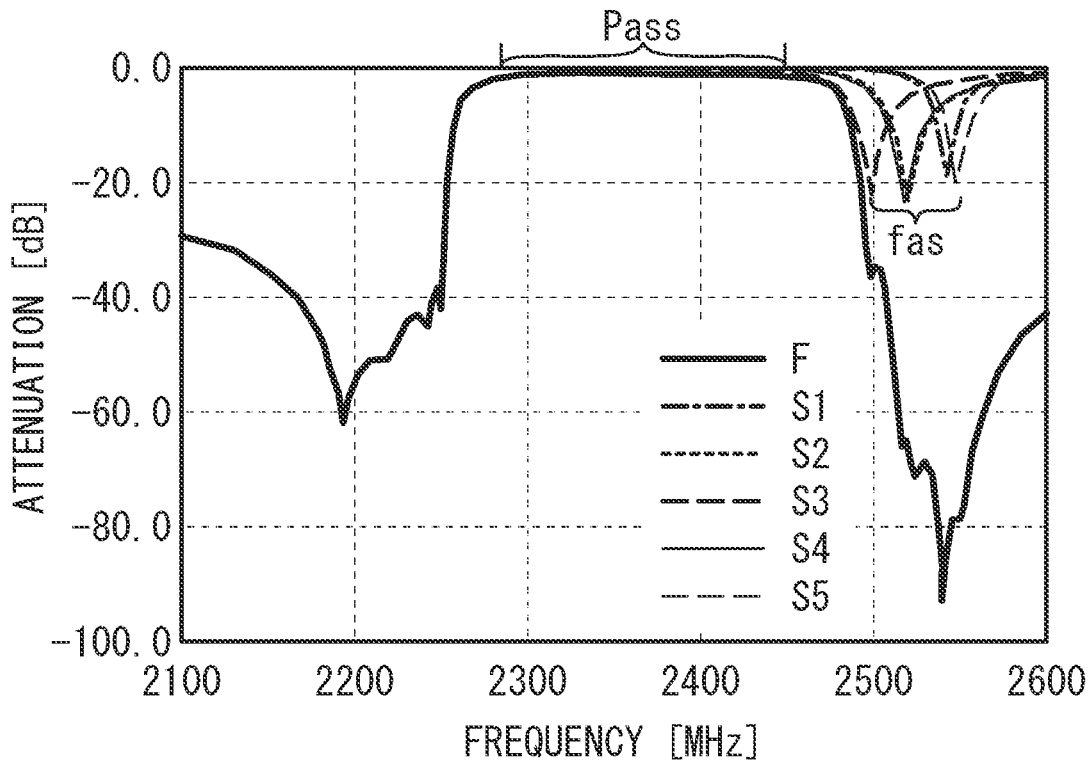
FIG. 11A and FIG. 11B schematically illustrate the transmission characteristics of the filter and the series resonator.
Figure 11B:
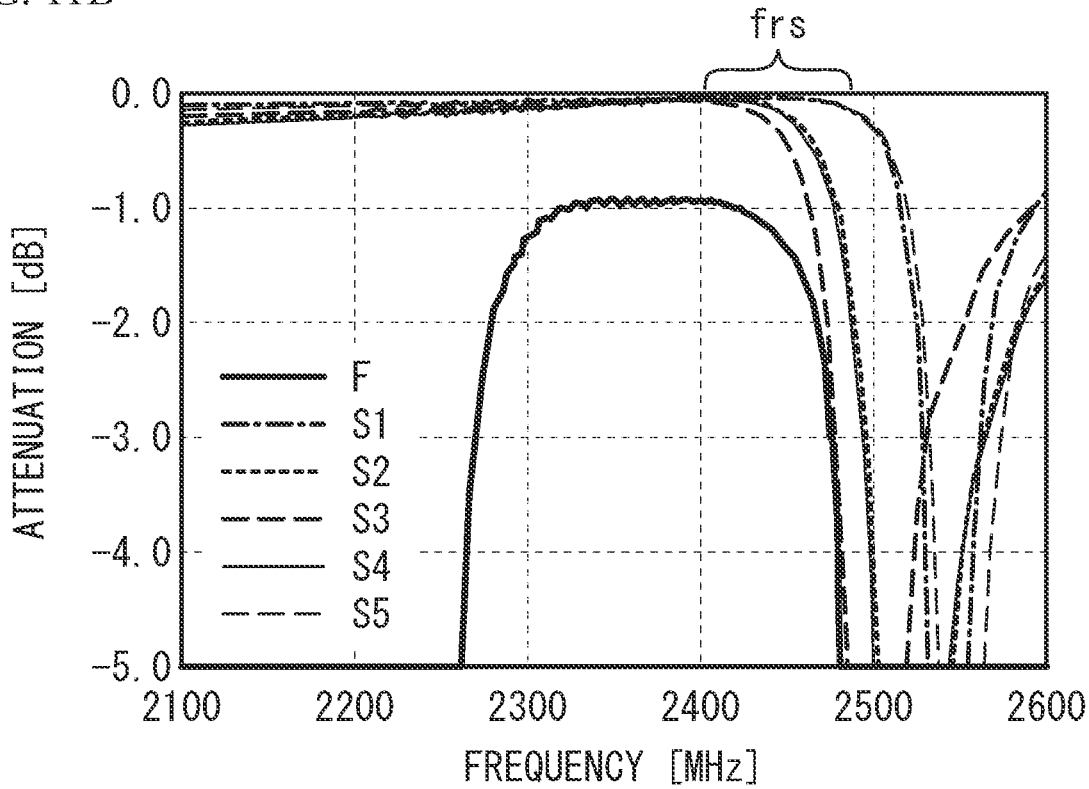

FIG. 11A and FIG. 11B schematically illustrate the transmission characteristics of the filter and the series resonator. FIG. 11B enlarges the attenuation in FIG. 11A. As illustrated in FIG. 11A and FIG. 11B, the resonant frequencies frs and the antiresonant frequencies fas of the series resonators S1 to S5 depend on the pitch D2. As illustrated in FIG. 2B, the resonant frequency frs also depends on the duty ratio R2, but depends on mainly the pitch D2 rather than the duty ratio R2. Therefore, even when the duty ratios R2 in the series resonators S1 to S5 differ from each other, the magnitude relationship among the antiresonant frequencies fas substantially depends on the magnitude relationship among the pitches D2. By making the antiresonant frequencies fas of the series resonators S1 to S5 different from each other, the attenuation range in the frequencies higher than the passband Pass can be widened. The high-frequency side skirt of the passband Pass is formed by the parallel resonator S3 having the lowest antiresonant frequency fas.

In the first variation of the first embodiment, the duty ratio R2 in the series resonator S3 having the lowest antiresonant frequency fas (i.e., the largest pitch D2) is made to be smallest to make the temperature coefficient of the antiresonant frequency fas closer to 0. This configuration can make the TCF of the high-frequency side skirt of the passband Pass closer to 0. The series resonators secondarily affecting the high-frequency side skirt of the passband Pass are the series resonators S2 and S4 having the second lowest antiresonant frequencies fas. Thus, the duty ratios R2 in the series resonators S2 and S4 are made to be the second lowest to make the temperature coefficient of the antiresonant frequency fas closer to 0. The series resonators S1 and S5 having high antiresonant frequencies fas have little effect on the low-frequency side skirt of the passband Pass. Thus, in consideration of the resonance characteristics, the duty ratios R2 in the series resonators S2 and S4 are adjusted to be the same as the duty ratios R1 in the parallel resonators P1 to P4.

As described above, the duty ratio R2 in the series resonator S3 affecting the high-frequency side skirt of the passband Pass is adjusted to be less than the duty ratios R1 in the parallel resonators P1 to P4 to make the TCF of the high-frequency side skirt of the passband Pass small. The duty ratios R2 in the series resonators S1 and S5 having little effect on the low-frequency side skirt of the passband Pass are adjusted to be substantially the same as the duty ratios R1 in the parallel resonators P1 to P4. This configuration can improve the resonance characteristics.

Second Variation of the First Embodiment

Figure 12A:
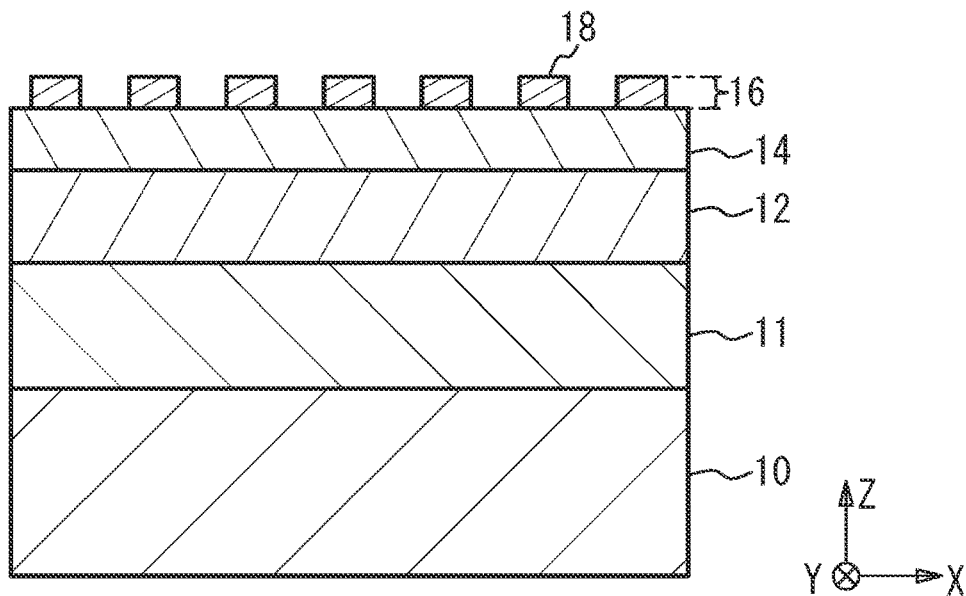
FIG. 12A to FIG. 12C are cross-sectional views of acoustic wave resonators in accordance with second to fourth variations of the first embodiment, respectively.

FIG. 12A is a cross-sectional view of an acoustic wave resonator in accordance with a second variation of the first embodiment. As illustrated in FIG. 12A, in the second variation of the first embodiment, a boundary layer 11 as an insulating layer is interposed between the temperature compensation film 12 and the support substrate 10. The acoustic velocity of the bulk wave propagating through the boundary layer 11 is greater than the acoustic velocity of the bulk wave propagating through the temperature compensation film 12. The boundary layer 11 is a polycrystalline film or an amorphous film composed of, for example, aluminum oxide, aluminum nitride, silicon, silicon nitride, or silicon carbide. Provision of the boundary layer 11 allows the acoustic wave that is the primary mode to be confined in the piezoelectric layer 14 and the temperature compensation film 12, and unnecessary waves such as the bulk wave to be attenuated in the boundary layer 11. Therefore, spurious emissions due to unnecessary waves can be reduced. The thickness of the boundary layer 11 is, for example, 1λ to 5λ. Other structures are the same as those of the first embodiment, and the description thereof is thus omitted.

Third Variation of the First Embodiment

Figure 12B:
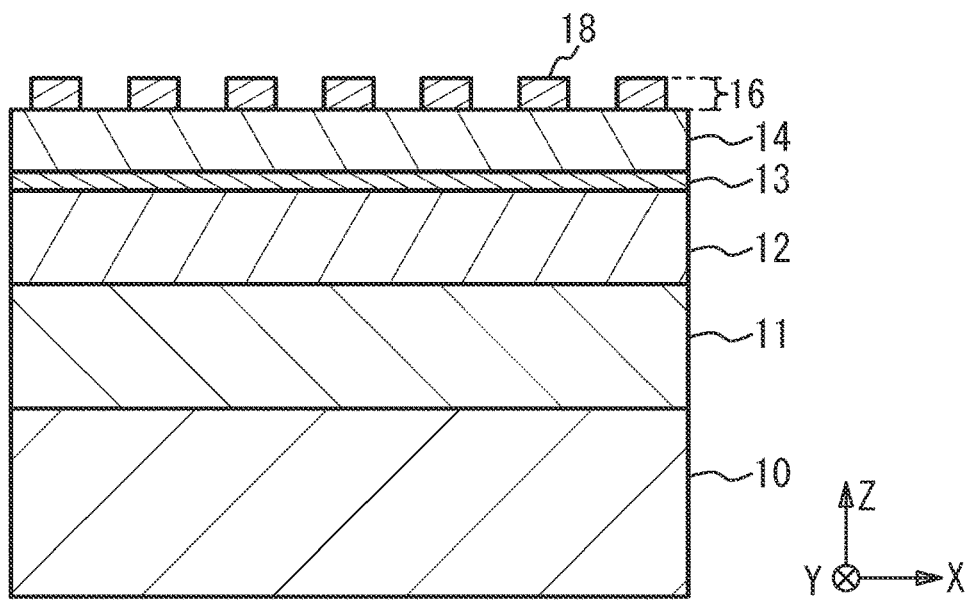

FIG. 12B is a cross-sectional view of an acoustic wave resonator in accordance with a third variation of the first embodiment. As illustrated in FIG. 12B, in the third variation of the first embodiment, a bonding layer 13 between the piezoelectric layer 14 and the temperature compensation film 12 is provided. The bonding layer 13 bonds the piezoelectric layer 14 to the temperature compensation film 12. When it is difficult to directly bond the piezoelectric layer 14 to the temperature compensation film 12, the bonding layer 13 may be provided. The bonding layer 13 is, for example, an aluminum oxide film, a silicon film, an aluminum nitride film, a silicon nitride film, or a silicon carbide film. The thickness of the bonding layer 13 is preferably 20 nm or less, more preferably 10 nm or less so as not to impair the functions of the piezoelectric layer 14 and the temperature compensation film 12. In order not to impair the function as the bonding layer 13, the thickness of the bonding layer 13 is preferably 1 nm or greater, more preferably 2 nm or greater. To confine the acoustic wave that is the primary mode in the piezoelectric layer 14, the acoustic velocity of the bulk wave propagating through the bonding layer 13 is preferably greater than the acoustic velocity of the bulk wave propagating through the temperature compensation film 12. Other structures are the same as those of the first embodiment, and the description thereof is thus omitted.

Fourth Variation of the First Embodiment

Figure 12C:
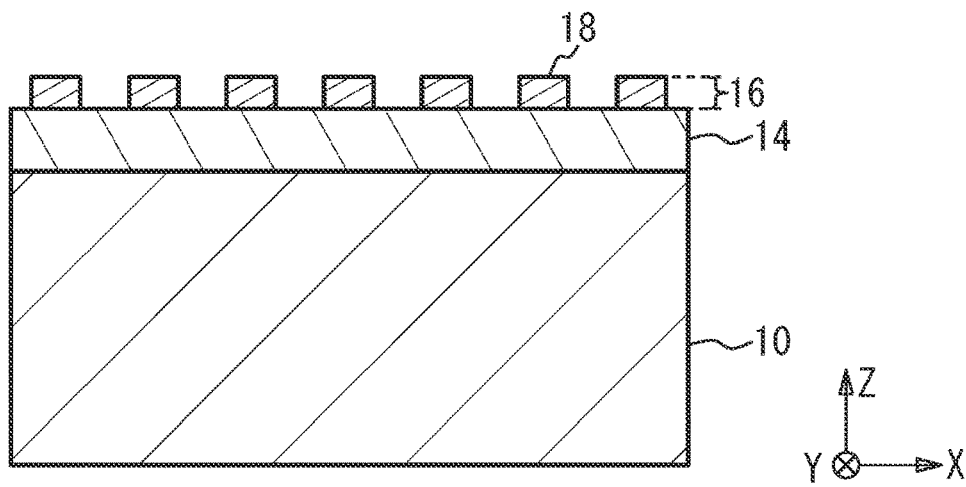

FIG. 12C is a cross-sectional view of an acoustic wave resonator in accordance with a fourth variation of the first embodiment. As illustrated in FIG. 12C, in the fourth variation of the first embodiment, no temperature compensation film is provided between the piezoelectric layer 14 and the support substrate 10. The piezoelectric layer 14 is directly bonded to the support substrate 10 by, for example, surface activation. Other structures are the same as those of the first embodiment, and the description thereof is thus omitted.

Fifth Variation of the First Embodiment

Figure 13A:
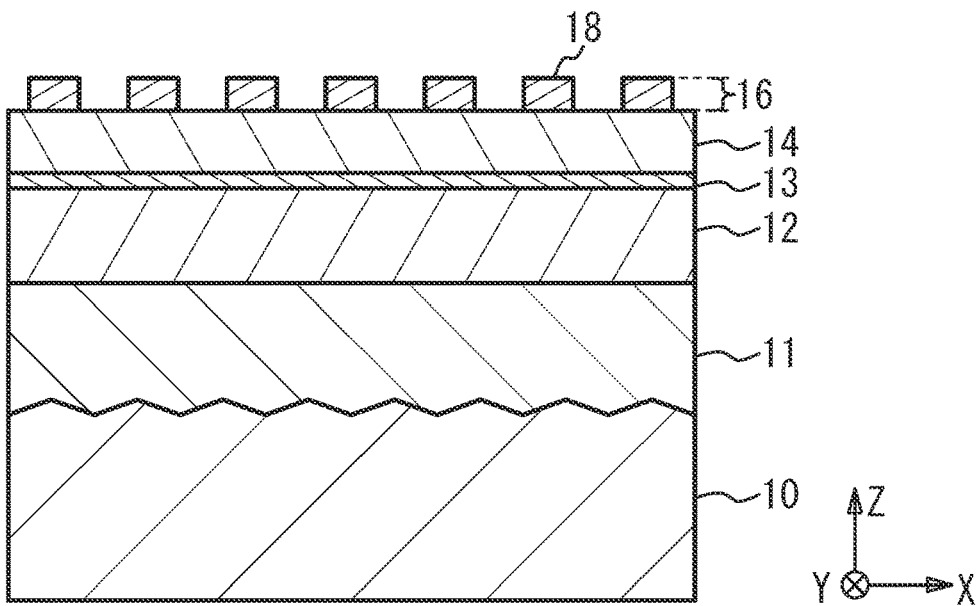
FIG. 13A to FIG. 13C are cross-sectional views of the acoustic wave resonator in accordance with fifth to seventh variations of the first embodiment, respectively.

FIG. 13A is a cross-sectional view of an acoustic wave resonator in accordance with a fifth variation of the first embodiment. As illustrated in FIG. 13A, in the fifth variation of the first embodiment, protrusions and/or recesses arranged at regular intervals or protrusions and/or recesses arranged irregularly are provided on the boundary face between the support substrate 10 and the boundary layer 11. The protrusions and/or recesses scatter unnecessary waves, and thereby, spurious emissions can be reduced. The boundary face between the boundary layer 11 and the temperature compensation film 12 is substantially flat. Other structures are the same as those of the third variation of the first embodiment, and the description thereof is thus omitted.

Sixth Variation of the First Embodiment

Figure 13B:
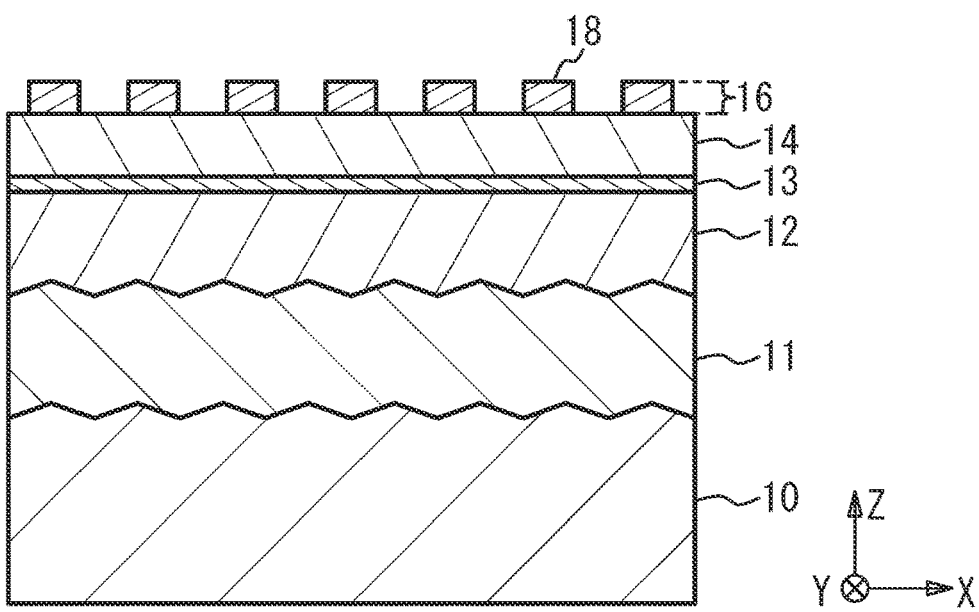

FIG. 13B is a cross-sectional view of an acoustic wave resonator in accordance with a sixth variation of the first embodiment. As illustrated in FIG. 13B, in the sixth variation of the first embodiment, protrusions and/or recesses arranged at regular intervals or protrusions and/or recesses arranged irregularly are provided on the boundary face between the boundary layer 11 and the temperature compensation film 12 in addition to the boundary face between the support substrate 10 and the boundary layer 11. The protrusions and/or recesses formed on two layers scatter unnecessary waves, and thereby, spurious emissions can be reduced. Other structures are the same as those of the fifth variation of the first embodiment, and the description thereof is thus omitted.

Seventh Variation of the First Embodiment

Figure 13C:
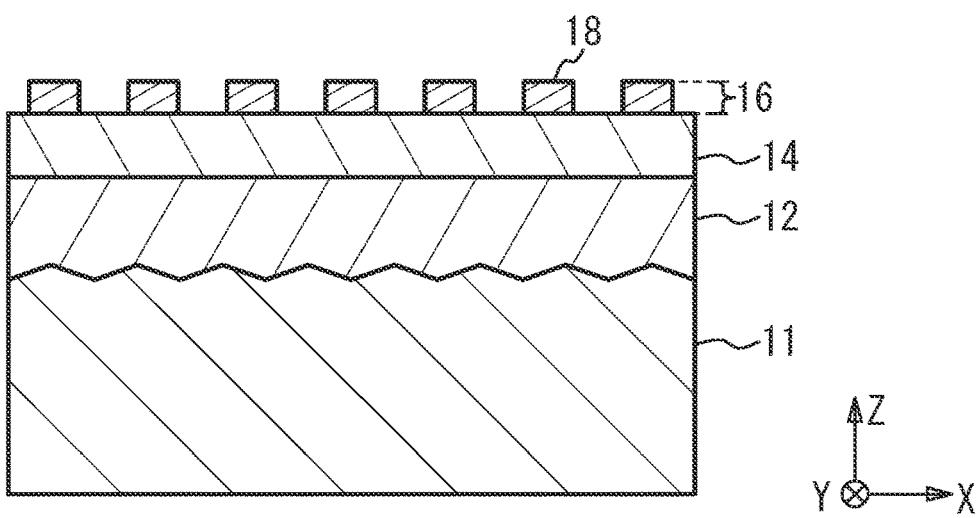

FIG. 13C is a cross-sectional view of an acoustic wave resonator in a seventh variation of the first embodiment. As illustrated in FIG. 13C, in the seventh variation of the first embodiment, protrusions and/or recesses arranged at regular intervals or protrusions and/or recesses arranged irregularly are provided on the boundary face between the support substrate 10 and the temperature compensation film 12. Other structures are the same as those of the first embodiment, and the description thereof is thus omitted.

Also in the second to seventh variations of the first embodiment, by adjusting the thickness T4 of the piezoelectric layer 14 to be equal to or less than the wavelength $\lambda$, the temperature coefficient of the resonant frequency fr and the temperature coefficient of the antiresonant frequency fa depend on the duty ratio R. Therefore, by adjusting the duty ratio R2 in the series resonator S to be less than the duty ratio R1 in the parallel resonator P, the TCF of the skirt of the passband Pass can be made to be closer to 0. As in the first embodiment and the first to third and fifth to seventh variations thereof, the insulating layer may be provided between the support substrate 10 and the piezoelectric layer 14. The insulating layer may be a single layer composed of a uniform material, or may be a layer formed by stacking a plurality of layers.

In the first embodiment and the variations thereof, the parallel resonator P includes the electrode fingers 18 (first electrode fingers) having an average pitch D1 (a first average pitch) and an average duty ratio R1 (a first average duty ratio). The series resonator S includes the electrode fingers 18 (second electrode fingers) having an average pitch D2 (a second average pitch) and an average duty ratio R2 (a second average duty ratio). In this structure, the largest average pitch D1 among those in the parallel resonators P1 to P4 is adjusted to be equal to or greater than two times the thickness T4 of the piezoelectric layer 14. That is, the thickness T4 of the piezoelectric layer 14 is adjusted to be equal to or less than the wavelength $\lambda$. This configuration makes the temperature coefficient of the resonant frequency fr and the temperature coefficient of the antiresonant frequency fa dependent on the duty ratio R as presented in FIG. 6. The average duty ratio R2 in at least one series resonator is adjusted to be less than the smallest average duty ratio R1 among the average duty ratios R1 in the parallel resonators. This configuration can reduce the TCF of the high-frequency end of the passband.

The largest average pitch D1 among those in the parallel resonators P1 to P4 is preferably equal to or greater than 1.6 times, more preferably equal to or greater than 1.2 times the thickness T4 of the piezoelectric layer 14. The difference between the average duty ratio R2 [%] in the at least one series resonator and the smallest average duty ratio R1 [%] is preferably 5% or greater, more preferably 10% or greater. The average pitch D is calculated by dividing the width of the IDT 22 in the X direction by the number of the electrode fingers 18. The average duty ratio R is calculated by dividing the width of the IDT 22 in the X direction by the sum of the widths of the electrode fingers 18.

In the case that the piezoelectric layer is a 36° or greater and 48° or less rotated Y-cut X-propagation lithium tantalate layer, the acoustic wave that is the primary mode is the SH wave. In the parallel resonator P and the series resonator S, no dielectric film covering the electrode fingers 18 and having a larger thickness than the electrode fingers 18 is provided on the piezoelectric layer 14. This structure makes the temperature coefficient of the resonant frequency fr and the temperature coefficient of the antiresonant frequency fa dependent on the duty ratio R as presented in FIG. 6.

The at least one series resonator includes a series resonator having the largest average pitch D2 (the series resonator S3 in Table 2 and FIG. 11A: a first series resonator). This configuration can reduce the temperature coefficient of the antiresonant frequency fa of the series resonator that mainly forms the high-frequency side skirt of the passband as in the first variation of the first embodiment, and therefore, the TCF of the high-frequency side skirt of the passband can be reduced.

The duty ratio R2 in the series resonator (the series resonators S1, S2, S4, and S5 in Table 2 and FIG. 11A: a second series resonator) having an average pitch D2 smaller than the average pitch D2 in the series resonator S3 is greater than the duty ratio R2 in the first series resonator S3. This configuration improves the resonance characteristics of the second series resonators S1, S2, S4, and S5. The difference between the duty ratio R2 [%] in the first series resonator and the duty ratio R2 [%] in the second series resonator is preferably 5% or greater, more preferably 10% or greater.

As in the first embodiment, the largest average duty ratio R2 is adjusted to be less than the smallest average duty ratio R1. That is, each of the average duty ratios R2 in the series resonators S1 to S5 is less than all the average duty ratios R1 in the parallel resonators P1 to P4. This configuration can reduce the TCF of the high-frequency side skirt of the passband. The difference between the largest average duty ratio R2 and the smallest average duty ratio R1 is preferably 5% or greater, more preferably 10% or greater.

The largest average pitch D2 is less than the smallest average pitch D1. That is, each of the resonant frequencies frs of the series resonators S1 to S5 is higher than all the resonant frequencies frp of the parallel resonators P1 to P4. Thus, the ladder-type filter can be formed.

As in the first variation of the first embodiment, since the temperature coefficients of the resonant frequencies frp of the parallel resonators P1 to P4 are small, the average duty ratios R1 of the parallel resonators P1 to P4 are adjusted to be substantially equal to each other to improve the resonance characteristics. On the other hand, the duty ratio R2 in the series resonator S3, which mainly forms the high-frequency side skirt of the passband, is adjusted to be small, and the duty ratios R2 in the series resonators S1 and S5, which have little contribution to forming of the high-frequency side skirt of the passband, are adjusted to be substantially the same as the duty ratios R1 in the parallel resonators P1 to P4. This configuration improves the resonance characteristics of the series resonators S1 and S5. That is, the difference between the largest average duty ratio R2 and the smallest average duty ratio R2 is preferably greater than the difference between the largest average duty ratio R1 and the smallest average duty ratio R1.

Second Embodiment

Figure 14:
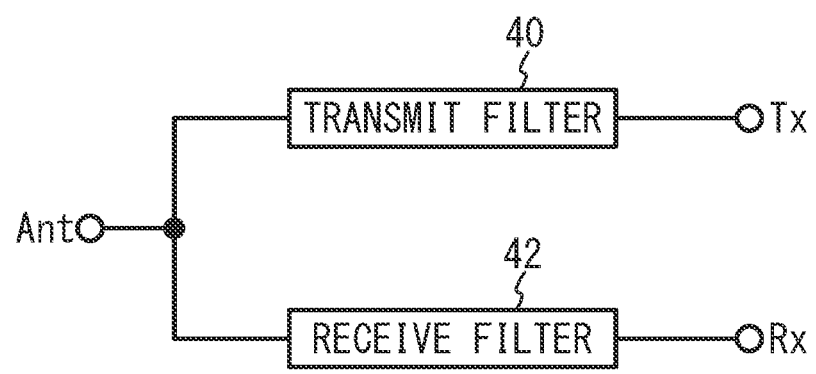
FIG. 14 is a circuit diagram of a duplexer in accordance with an embodiment.

FIG. 14 is a circuit diagram of a duplexer in accordance with an embodiment. As illustrated in FIG. 14, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among high-frequency signals input from the transmit terminal Tx, and suppresses signals with other frequencies. The receive filter 42 transmits signals in the receive band to the receive terminal Rx as reception signals among high-frequency signals input from the common terminal Ant, and suppresses signals with other frequencies. At least one of the transmit filter 40 or the receive filter 42 may be the filter according to any one of the first embodiment and the variations of the first embodiment.

The duplexer has been described as a multiplexer, but the multiplexer may be a triplexer or a quadplexer.

Although the embodiments of the present invention have been described in detail, the present invention is not limited to such a specific embodiment, and it is to be understood that the various change, substitutions, and alterations could be made hereto without departing from the spirit and scope of the invention.

What is claimed is:

1. A ladder-type filter comprising:
a support substrate;
a piezoelectric layer provided on the support substrate;
one or more parallel resonators each including a plurality of first electrode fingers provided on the piezoelectric layer, the first electrode fingers having a first average pitch and a first average duty ratio, a largest first average pitch being equal to or greater than two times a thickness of the piezoelectric layer, a first end of each of the one or more parallel resonators being coupled to a path between an input terminal and an output terminal, a second end of each of the one or more parallel resonators being coupled to a ground; and
one or more series resonators connected in series between the input terminal and the output terminal, each of the one or more series resonators including a plurality of second electrode fingers provided on the piezoelectric layer, the second electrode fingers having a second average pitch and a second average duty ratio, the second average duty ratio in at least one series resonator being less than a smallest first average duty ratio,
wherein the one or more series resonators are a plurality of series resonators, the at least one series resonator includes a first series resonator having a largest second average pitch;
wherein a second series resonator among the series resonators has a second average pitch less than the second average pitch of the first series resonator; and
wherein the second series resonator has a second average duty ratio greater than a second average duty ratio in the first series resonator.

2. The ladder-type filter according to claim 1, wherein the piezoelectric layer is a 36° or greater and 48° or less rotated Y-cut X-propagation lithium tantalate layer.

3. The ladder-type filter according to claim 2,
wherein no dielectric film covering the first electrode fingers and having a thickness greater than thicknesses of the first electrode fingers is provided on the piezoelectric layer in each of the one or more parallel resonators, and
wherein no dielectric film covering the second electrode fingers and having a thickness greater than thicknesses of the second electrode fingers is provided on the piezoelectric layer in each of the one or more series resonators.

4. The ladder-type filter according to claim 1, wherein each of the second average duty ratios in the one or more series resonators is less than the all of the first average duty ratios in the one or more parallel resonators.

5. The ladder-type filter according to claim 1, wherein each of the second average pitches in the one or more series resonators is less than all of the first average pitches in the one or more parallel resonators.

6. A ladder-type filter comprising:
a support substrate;
a piezoelectric layer provided on the support substrate;
one or more parallel resonators each including a plurality of first electrode fingers provided on the piezoelectric layer, the first electrode fingers having a first average pitch and a first average duty ratio, a largest first average pitch being equal to or greater than two times a thickness of the piezoelectric layer, a first end of each of the one or more parallel resonators being coupled to a path between an input terminal and an output terminal, a second end of each of the one or more parallel resonators being coupled to a ground; and
one or more series resonators connected in series between the input terminal and the output terminal, each of the one or more series resonators including a plurality of second electrode fingers provided on the piezoelectric layer, the second electrode fingers having a second average pitch and a second average duty ratio, the second average duty ratio in at least one series resonator being less than a smallest first average duty ratio,
wherein a difference between a largest second average duty ratio and a smallest second average duty ratio is greater than a difference between a largest first average duty ratio and the smallest first average duty ratio.

7. A ladder-type filter comprising:
a support substrate;
a piezoelectric layer provided on the support substrate;
one or more parallel resonators each including a plurality of first electrode fingers provided on the piezoelectric layer, the first electrode fingers having a first average pitch and a first average duty ratio, a largest first average pitch being equal to or greater than two times a thickness of the piezoelectric layer, a first end of each of the one or more parallel resonators being coupled to a path between an input terminal and an output terminal, a second end of each of the one or more parallel resonators being coupled to a ground;

one or more series resonators connected in series between the input terminal and the output terminal, each of the one or more series resonators including a plurality of second electrode fingers provided on the piezoelectric layer, the second electrode fingers having a second average pitch and a second average duty ratio, the second average duty ratio in at least one series resonator being less than a smallest first average duty ratio; and a temperature compensation film provided between the support substrate and the piezoelectric layer, the temperature compensation film having a temperature coefficient of elastic constant opposite in sign to a temperature coefficient of elastic constant of the piezoelectric layer.

8. A multiplexer comprising:
the ladder-type filter according to claim 1.

9. The ladder-type filter according to claim 1,
wherein the one or more parallel resonators have a pair of comb-shaped electrodes including the plurality of first electrode fingers, and reflectors,
wherein the one or more series resonators have a pair of comb-shaped electrodes including the plurality of second electrode fingers, and reflectors.

* * * * *